United States Patent
Seki et al.

(10) Patent No.: US 10,414,013 B2
(45) Date of Patent: Sep. 17, 2019

(54) POLISHING METHOD AND POLISHING APPARATUS

(71) Applicant: Ebara Corporation, Tokyo (JP)

(72) Inventors: Masaya Seki, Tokyo (JP); Manao Hoshina, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 16/166,767

(22) Filed: Oct. 22, 2018

(65) Prior Publication Data

US 2019/0054589 A1 Feb. 21, 2019

Related U.S. Application Data

(63) Continuation of application No. 15/118,184, filed as application No. PCT/JP2015/053820 on Feb. 12, 2015, now Pat. No. 10,144,103.

(30) Foreign Application Priority Data

Feb. 17, 2014 (JP) ................................. 2014-027780

(51) Int. Cl.
*B24B 37/04* (2012.01)
*B24B 9/06* (2006.01)
(Continued)

(52) U.S. Cl.
CPC ............ *B24B 9/065* (2013.01); *B24B 21/002* (2013.01); *B24B 21/004* (2013.01);
(Continued)

(58) Field of Classification Search
CPC ........ B24B 37/04; B24B 21/002; B24B 9/065
(Continued)

(56) References Cited

U.S. PATENT DOCUMENTS 4,930,259 A * 6/1990 Kobylenski .............. B24B 7/16
451/303
5,099,615 A * 3/1992 Ruble ...................... B24B 7/17
451/11
(Continued)

FOREIGN PATENT DOCUMENTS

EP 2067571 A2 6/2009
EP 2502701 A2 9/2012
(Continued)

OTHER PUBLICATIONS

European Patent Office, Supplementary European Search Report in European Application No. 15748812.3 (dated Oct. 2, 2017).
(Continued)

*Primary Examiner* — Robert A Rose
(74) *Attorney, Agent, or Firm* — Leydig, Voit & Mayer, Ltd.

(57) ABSTRACT

The present invention relates to a polishing apparatus and a polishing method for polishing a substrate, such as a wafer, and more particularly to a polishing apparatus and a polishing method for polishing an edge portion of a wafer with use of a polishing tape.
The polishing apparatus includes a substrate holder (1) configured to hold and rotate a substrate (W), and a polishing unit (7) configured to polish an edge portion of the substrate (W) with use of a polishing tape (5). The polishing unit (7) includes: a disk head (12) having a circumferential surface for supporting the polishing tape (5); and a head moving device (50) configured to move the disk head (12) in a tangential direction of the substrate (W) and to bring the polishing tape (5) on the circumferential surface of the disk head (12) into contact with the edge portion of the substrate (W).

13 Claims, 7 Drawing Sheets

(51) Int. Cl.
  *B24B 21/00* (2006.01)
  *H01L 21/02* (2006.01)

(52) U.S. Cl.
  CPC ............ *B24B 21/008* (2013.01); *B24B 37/04* (2013.01); *H01L 21/02021* (2013.01)

(58) Field of Classification Search
  USPC .............................. 451/44, 168, 173, 57, 59
  See application file for complete search history.

(56) References Cited

U.S. PATENT DOCUMENTS

| | | | |
|---|---|---|---|
| 5,433,415 A * | 7/1995 | Samson | A47B 23/043 |
| | | | 248/448 |
| 5,443,415 A | 8/1995 | Shebanow et al. | |
| 5,643,044 A * | 7/1997 | Lund | B24B 21/00 |
| | | | 451/168 |
| 7,115,023 B1 | 10/2006 | Owczarz | |
| 9,199,352 B2 | 12/2015 | Seki et al. | |
| 2004/0185751 A1 | 9/2004 | Nakanishi et al. | |
| 2008/0293344 A1 | 11/2008 | Ettinger et al. | |
| 2009/0142992 A1 | 6/2009 | Takahashi et al. | |
| 2009/0156104 A1 | 6/2009 | Kim et al. | |
| 2012/0045968 A1 | 2/2012 | Hosokai et al. | |
| 2012/0252320 A1 | 10/2012 | Seki et al. | |
| 2014/0213155 A1 * | 7/2014 | Togawa | B24B 21/008 |
| | | | 451/44 |

FOREIGN PATENT DOCUMENTS

| | | |
|---|---|---|
| JP | 1-115562 A | 5/1989 |
| JP | 9-85599 A | 3/1997 |
| JP | 10-217077 A | 8/1998 |
| JP | H11-198015 A | 7/1999 |
| JP | 2002-126981 A | 5/2002 |
| JP | 2003-175449 A | 6/2003 |
| JP | 2011-161625 A | 8/2011 |
| JP | 2012-213849 A | 11/2012 |
| JP | 2012-231191 A | 11/2012 |
| JP | 2013-188839 A | 9/2013 |
| JP | 2014/027000 A | 2/2014 |

OTHER PUBLICATIONS

Japan Patent Office, International Search Report in International Application No. PCT/JP2015/053820 (dated Mar. 10, 2015).
Japan Patent Office, Notification of Reasons for Refusal in Japanese Patent Application No. 2017-168396 (dated May 1, 2018).

\* cited by examiner

MOVING DIRECTION OF WAFER EDGE

POLISHING METHOD AND POLISHING APPARATUS

CROSS-REFERENCE TO RELATED APPLICATIONS

This patent application is a continuation of U.S. patent application Ser. No. 15/118,184, filed on Aug. 11, 2016, which is the U.S. national phase of International Application No. PCT/JP2015/053820, filed Feb. 12, 2015, which claims the benefit of Japanese Patent Application No. 2014-027780, filed on Feb. 17, 2014, which are incorporated by reference in their entireties herein.

TECHNICAL FIELD

The present invention relates to a polishing apparatus and a polishing method for polishing a substrate, such as a wafer, and more particularly to a polishing apparatus and a polishing method for polishing an edge portion of a wafer with use of a polishing tape.

BACKGROUND ART

FIG. 11 is a schematic view showing a polishing apparatus for polishing an edge portion of a wafer W with use of a polishing tape 101. The polishing apparatus is configured to press the polishing tape 101 downwardly against the edge portion of the wafer W with a pressing member 100 while rotating the wafer W to thereby polish the edge portion. A lower surface of the polishing tape 101 provides a polishing surface with abrasive grains fixed thereto. The pressing member 100 has a flat lower surface, which presses the polishing tape 101 downwardly against the edge portion of the wafer W, thereby forming a step in the edge portion as shown in FIG. 12. This step is constituted by a vertical surface and a horizontal surface.

CITATION LIST

Patent Literature

Patent document 1: U.S. Patent Application Publication No. US 2008/0293344

SUMMARY OF INVENTION

Technical Problem

However, during polishing of the wafer W, a frictional force acting between the polishing tape 101 and the wafer W may cause the polishing tape 101 to be displaced from a predetermined position on the pressing member 100. In such a case, the vertical surface to be formed in the edge portion becomes rough. In order to form a smooth vertical surface in the edge portion, two polishing tapes, one of which is a rough-polishing tape having a rough polishing surface and the other is a finish-polishing tape having a fine polishing surface, may be used to polish the edge portion of the wafer W. However, as can be seen from FIG. 11, during polishing of the wafer W, the rough-polishing tape is always in contact with the vertical surface of the edge portion. As a result, the vertical surface of the edge portion is roughened by the contact with the rough-polishing tape. It is possible to form a smooth vertical surface by using only the finish-polishing tape. However, using only the finish-polishing tape results in a lowered polishing rate and a lowered throughput of the polishing apparatus.

Thus, it is an object of the present invention to provide a polishing apparatus and a polishing method capable of preventing a displacement of a polishing tape during polishing of a substrate, such as a wafer, and capable of forming a smooth vertical surface in an edge portion of the substrate.

Solution to Problem

In order to achieve the object, one aspect of the present invention provides a polishing apparatus comprising: a substrate holder configured to hold and rotate a substrate; and a polishing unit configured to polish an edge portion of the substrate with use of a polishing tape, the polishing unit including: a disk head having a circumferential surface for supporting the polishing tape; and a head moving device configured to move the disk head in a tangential direction of the substrate and to bring the polishing tape on the circumferential surface of the disk head into contact with the edge portion of the substrate, wherein the disk head has its central axis which is parallel to a surface of the substrate and is perpendicular to the tangential direction.

In a preferred aspect of the present invention, the polishing unit further includes: a first reel and a second reel holding both ends of the polishing tape; and a first motor and a second motor configured to generate torques for rotating the first reel and the second reel in opposite directions.

In a preferred aspect of the present invention, the polishing unit further includes a nip roller configured to press the polishing tape against the circumferential surface of the disk head to curve the polishing tape along the circumferential surface.

In a preferred aspect of the present invention, the polishing unit further includes a nip-roller moving device configured to move the nip roller around the central axis of the disk head.

In a preferred aspect of the present invention, the polishing unit further includes a head motor configured to rotate the disk head about the central axis thereof.

In a preferred aspect of the present invention, the polishing unit is one of a plurality of polishing units.

In a preferred aspect of the present invention, the plurality of polishing units include a first polishing unit with a first polishing tape, and a second polishing unit with a second polishing tape having a polishing surface which is finer than that of the first polishing tape.

Another aspect of the present invention provides a polishing method comprising: rotating a substrate about its central axis; pressing a first polishing tape against an edge portion of the substrate by a circumferential surface of a first disk head while moving the first disk head in a tangential direction of the substrate, thereby forming a step in the edge portion; and pressing a second polishing tape against the step by a circumferential surface of a second disk head while moving the second disk head in a tangential direction of the substrate, thereby polishing the step, the second polishing tape having a polishing surface which is finer than a polishing surface of the first polishing tape.

Advantageous Effects of Invention

According to the present invention, a relatively large static friction acts between the polishing tape in contact with the substrate and the circumferential surface of the disk head, as compared with the case where the flat surface of the pressing member, shown in FIG. 11, presses a polishing tape against a substrate. Therefore, a displacement of the polishing tape from a predetermined position can be prevented during polishing of the substrate.

Further, according to the present invention, the polishing tape is pressed by the circumferential surface of the disk head against the edge portion of the substrate, while the disk head is moving in the tangential direction of the substrate. With this operation, polishing of the edge portion progresses from the outside to the inside of the edge portion gradually. Accordingly, a smooth vertical surface can be formed in the edge portion by polishing the edge portion with the first polishing tape having a rough polishing surface to form a step in the edge portion and further polishing the step with the second polishing tape having a fine polishing surface.

DESCRIPTION OF EMBODIMENTS

Embodiments will be described below with reference to the drawings.

Figure 1:
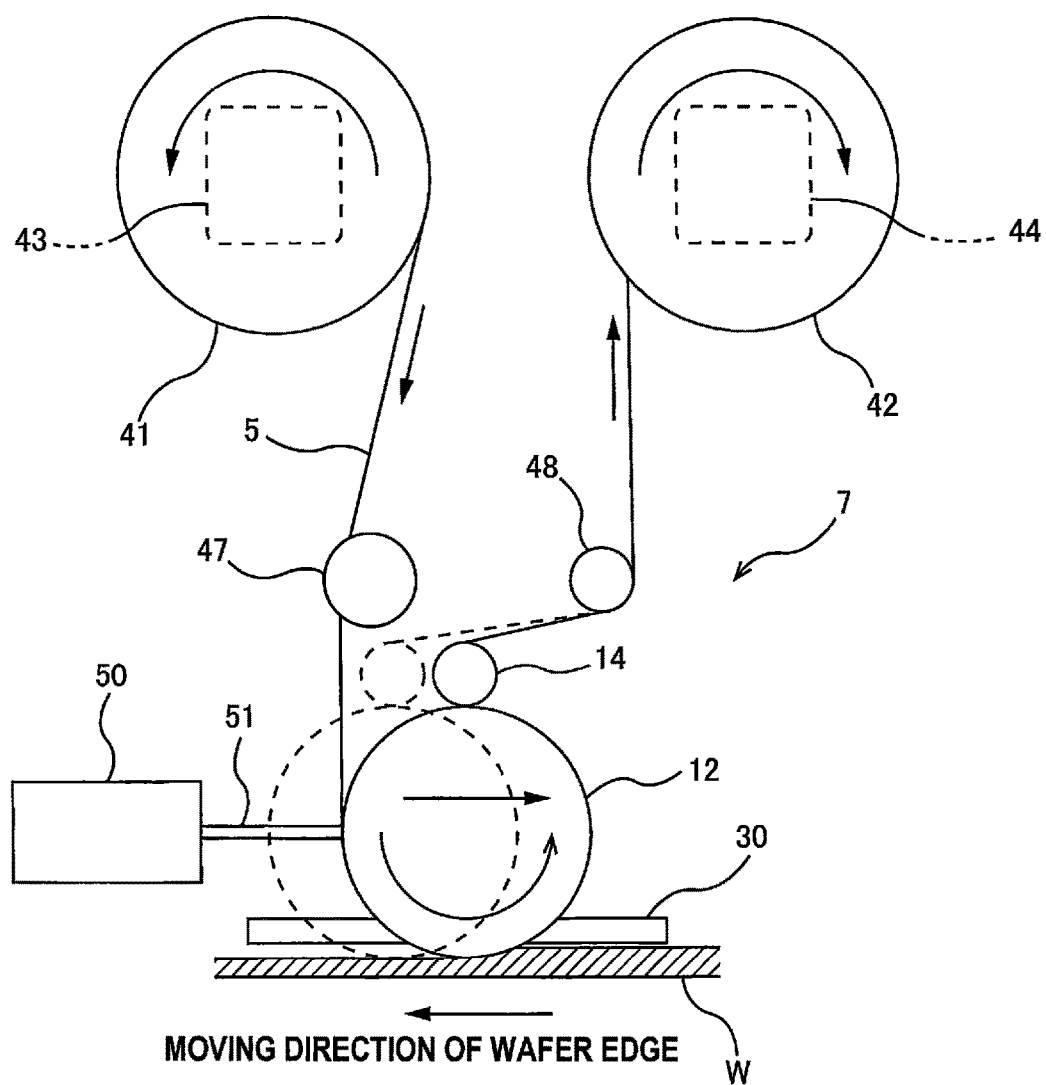
FIG. 1 is a front view showing an embodiment of a polishing apparatus.
Figure 2:
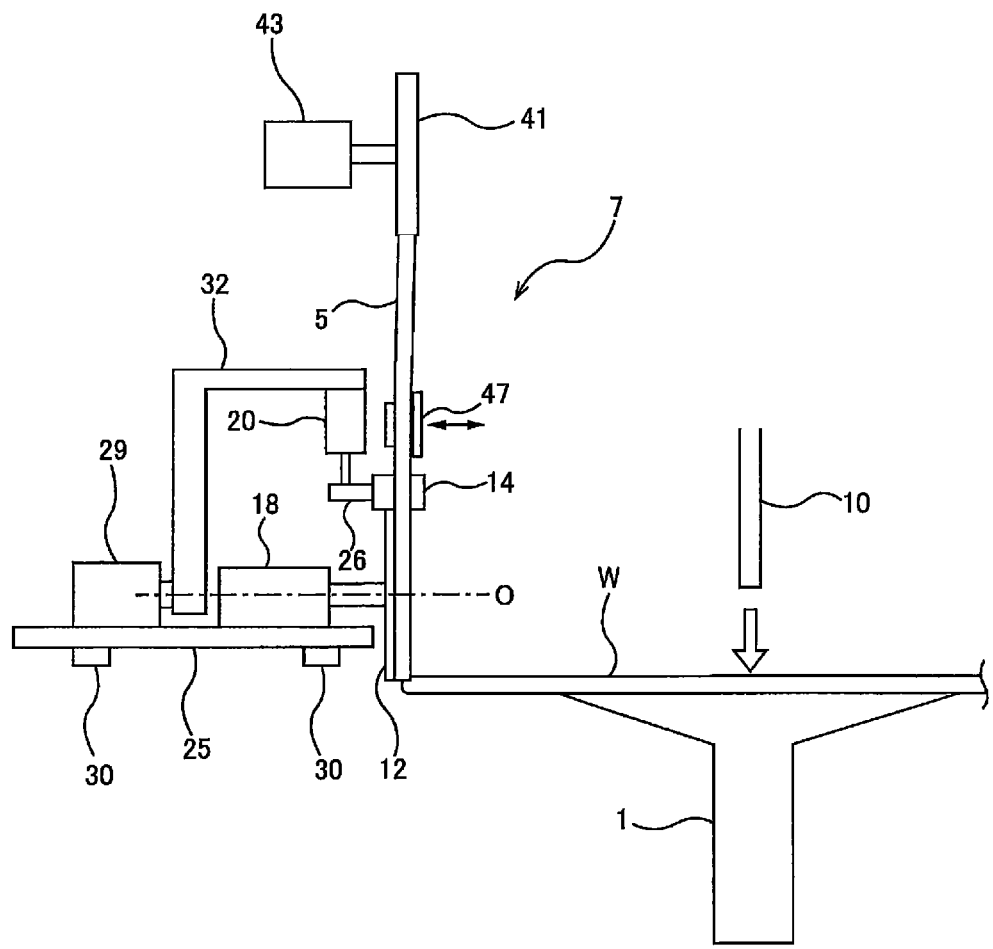
FIG. 2 is a side view of the polishing apparatus.

FIG. 1 is a front view showing an embodiment of a polishing apparatus, and FIG. 2 is a side view of the polishing apparatus. The polishing apparatus includes a substrate holder 1 for holding and rotating a wafer W which is an example of a substrate, and a polishing unit 7 for polishing an edge portion of the wafer W with use of a polishing tape 5 which is a polishing tool. The substrate holder 1 is configured to hold a lower surface of the wafer W and rotate the wafer W horizontally about its central axis.

A polishing-liquid supply nozzle 10 for supplying a polishing liquid, such as pure water, onto an upper surface of the wafer W is disposed above a central portion of the wafer W held by the substrate holder 1. During polishing of the edge portion of the wafer W, the polishing liquid is supplied from the polishing-liquid supply nozzle 10 onto the central portion of the wafer W. The polishing liquid spreads over the entirety of the upper surface of the wafer W by a centrifugal force, thereby protecting the wafer W from polishing debris.

The polishing unit 7 includes a disk head 12 having a circumferential surface for supporting the polishing tape 5 thereon, a nip roller 14 for pressing the polishing tape 5 against the circumferential surface of the disk head 12, and a head motor 18 for rotating the disk head 12 about its central axis O. This central axis O of the disk head 12 is parallel with a surface (an upper surface) of the wafer W held by the substrate holder 1, and is perpendicular to a tangential direction of the wafer W. The disk head 12 is coupled to a drive shaft of the head motor 18. This head motor 18 is configured to rotate the disk head 12 at a predetermined speed.

The head motor 18 is secured to a base 25. The nip roller 14 is rotatably held by a bearing arm 26, which is held by a pneumatic cylinder 20 serving as a nip-roller biasing device. This pneumatic cylinder 20 is configured to bias the nip roller 14 toward the center of the disk head 12 through the bearing arm 26. The nip-roller biasing device may be a spring, instead of the pneumatic cylinder 20.

The pneumatic cylinder 20 is held by a pivot arm 32, which is coupled to a rotational shaft of a pivoting motor 29 which serves as a nip-roller moving device. This pivoting motor 29 is secured to the base 25. The rotational shaft of the pivoting motor 29 is aligned with the central axis O of the disk head 12. Therefore, when the pivoting motor 29 is set in motion, the nip roller 14 moves around the central axis O along the circumferential surface of the disk head 12. The nip roller 14 has a central axis which is parallel with the central axis O of the disk head 12.

The base 25 is supported by horizontal linear guides 30 each extending in a direction parallel with the tangential direction of the wafer W. The movement direction of the base 25, which is supported by the horizontal linear guides 30, is restricted to a direction parallel with the tangential direction of the wafer W. The head motor 18 and the pivoting motor 29 are secured to the base 25. Therefore, the disk head 12, the nip roller 14, the head motor 18, and the pivoting motor 29 are movable together with the base 25. When viewed from above the wafer W, the disk head 12 and the nip roller 14 are located on a tangent of the wafer W.

The polishing unit 7 further includes a first tension reel 41 and a second tension reel 42 holding both ends of the polishing tape 5, respectively, and a first tension motor 43 and a second tension motor 44 configured to generate torques for rotating the first tension reel 41 and the second tension reel 42 in opposite directions. The first tension reel 41 and the second tension reel 42 are arranged above the disk head 12.

The polishing tape 5 extends from the first tension reel 41 to the second tension reel 42 via the disk head 12. Since the torques for rotating the first tension reel 41 and the second tension reel 42 in opposite directions are applied to these tension reels 41, 42, the polishing tape 5 is tensioned. A first guide roller 47 and a second guide roller 48 are arranged between the first and second tension reels 41, 42 and the disk head 12. The first guide roller 47 and the second guide roller 48 support the polishing tape 5 extending between the first and second tension reels 41, 42 and the disk head 12.

Figure 11:
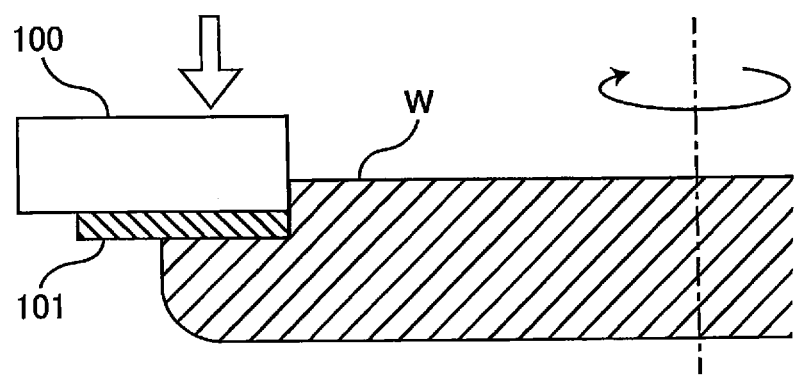
FIG. 11 is a schematic view showing a polishing apparatus for polishing an edge portion of a wafer with use of a polishing tape.

The polishing tape 5 is curved along the circumferential surface of the disk head 12. This curved portion of the polishing tape 5 is brought into contact with the wafer W. A relatively large static friction acts between the polishing tape 5 in contact with the wafer W and the circumferential surface of the disk head 12, as compared with the case where the flat surface of the pressing member 100, shown in FIG. 11, presses the polishing tape 101 against a wafer W. Therefore, a displacement of the polishing tape 5 from a predetermined position can be prevented during polishing of the wafer W. In order for the disk head 12 to hold the polishing tape 5, a vacuum suction hole for attracting the polishing tape 5 by the action of vacuum suction may be formed in the circumferential surface of the disk head 12.

The polishing tape 5 has one side surface which provides a polishing surface holding abrasive grains thereon, and has other side surface (i.e., rear surface) which is supported by the circumferential surface of the disk head 12. The circumferential surface of the disk head 12 may have a width larger than a width of the polishing tape 5. A position of an inside edge (i.e., a wafer-side edge or a substrate-side edge) of the polishing tape 5 may preferably coincide with a position of an edge of the disk head 12. The nip roller 14 is configured to press the rear surface of the polishing tape 5 against the circumferential surface of the disk head 12 so as to curve the polishing tape 5 along the circumferential surface of the disk head 12, thereby increasing a contact area of the polishing tape 5 and the disk head 12. The polishing tape 5 is sandwiched between the nip roller 14 and the disk head 12.

The polishing tape 5 is curved along the circumferential surface of the disk head 12, and is wound on the circumferential surface of the disk head 12 by the nip roller 14. A relatively large static friction acts between the rear surface of the polishing tape 5 and the circumferential surface of the disk head 12, thus ensuring the prevention of a displacement of the polishing tape 5. A length of the polishing tape 5 in contact with the circumferential surface of the disk head 12, i.e., a contact area of the polishing tape 5 and the disk head 12, varies in accordance with the position of the nip roller 14. The pivoting motor 29, which serves as the nip-roller moving device, is configured to move the nip roller 14 around the central axis O of the disk head 12, so that the length of the polishing tape 5 in contact with the circumferential surface of the disk head 12 can be changed.

In order to increase the static friction, the length of the polishing tape 5 in contact with the circumferential surface of the disk head 12 may preferably be not less than half of an entire circumference of the disk head 12. The nip roller 14 may preferably be disposed at a position such that the polishing tape 5 extends at least half around the disk head 12. In the embodiment shown in FIG. 1, the nip roller 14 is disposed at a position such that the polishing tape 5 extends three-quarters of the entire circumference of the disk head 12.

The first guide roller 47 is configured to be movable in directions parallel to the central axis O of the disk head 12. A position of the polishing tape 5 relative to the disk head 12 with respect to an axial direction of the disk head 12 (i.e., an extending direction of the central axis O) is adjusted by the first guide roller 47.

When the disk head 12 is rotated by the head motor 18, the polishing tape 5 is pulled out from the first tension reel 41, advances in a circumferential direction of the disk head 12 in synchronization with the rotation of the disk head 12, and is taken up by the second tension reel 42. The polishing tape 5 advances from the first tension reel 41 to the second tension reel 42 via the first guide roller 47, the disk head 12, the nip roller 14, and the second guide roller 48 in this order.

As shown in FIG. 1, the polishing unit 7 further includes a pneumatic cylinder 50 as a head moving device for moving the disk head 12 and the nip roller 14 in the tangential direction of the wafer W. The pneumatic cylinder 50 has a piston rod 51 which is coupled to the base 25 (see FIG. 2). As discussed previously, the disk head 12 and the nip roller 14 are movable together with the base 25. Therefore, the pneumatic cylinder 50 moves the disk head 12 and the nip roller 14 in the tangential direction of the wafer W, with the polishing tape 5 being supported on the circumferential surface of the disk head 12. Instead of the pneumatic cylinder 50, a combination of a ball screw and a servomotor may be used as the head moving device for moving the disk head 12 and the nip roller 14 in the tangential direction of the wafer W while the central axis O of the disk head 12 is perpendicular to the tangential direction of the wafer W.

The pneumatic cylinder 50 is configured to move the disk head 12 in the tangential direction of the wafer W so as to bring the polishing tape 5 on the circumferential surface of the disk head 12 into contact with the edge portion of the wafer W. The polishing tape 5 is pressed by a lower end portion of the disk head 12 against the edge portion of the wafer W. The moving direction and the rotating direction of the disk head 12 are opposite to the moving direction of the edge portion of the wafer W. This is for increasing a polishing rate of the wafer W.

Figure 12:
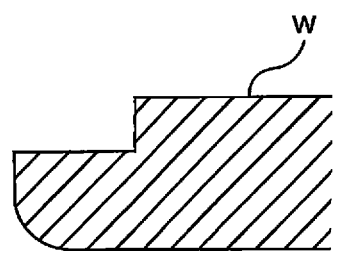
FIG. 12 is a cross-sectional view showing a step formed in the edge portion.

Polishing of the edge portion of the wafer W is performed as follows. The wafer W is horizontally held by the substrate holder 1 and is rotated about the central axis of the wafer W. The polishing liquid (e.g., pure water) is supplied from the polishing-liquid supply nozzle 10 onto the central portion of the wafer W. While the head motor 18 rotates the disk head 12 at a predetermined speed, the pneumatic cylinder 50 moves the disk head 12 and the nip roller 14 together with the polishing tape 5 in the tangential direction of the wafer W to bring the polishing tape 5 on the circumferential surface of the disk head 12 into contact with the edge portion of the wafer W. As the pneumatic cylinder 50 moves the disk head 12, lowermost end portion of the disk head 12 presses the polishing tape 5 against the edge portion of the wafer W. The edge portion of the wafer W is polished by the polishing tape 5, so that a step as shown in FIG. 12 is formed in the edge portion.

During polishing of the wafer W, the polishing tape 5 is curved along the circumferential surface of the disk head 12, and is wound on the circumferential surface of the disk head 12 by the nip roller 14. Therefore, a relatively large static friction acts between the rear surface of the polishing tape 5 and the circumferential surface of the disk head 12, thereby preventing a displacement of the polishing tape 5. Therefore, the polishing tape 5 can form a smooth vertical surface (see FIG. 12) in the edge portion of the wafer W.

Figure 3:
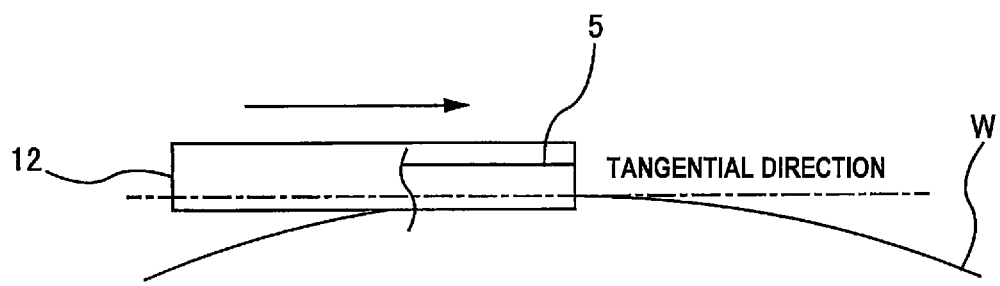
FIG. 3 is a plan view showing a relative position of a disk head and an edge portion of a wafer when a polishing tape is brought into contact with the edge portion of the wafer.
Figure 4:
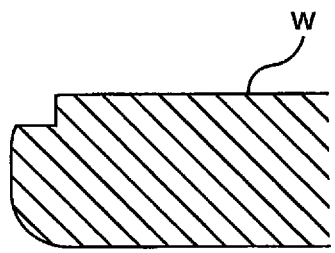
FIG. 4 is a cross-sectional view of the edge portion that has been polished by the polishing tape when the disk head is in a position shown in FIG. 3.

FIG. 3 is a plan view showing a relative position of the disk head 12 and the edge portion of the wafer W when the polishing tape 5 is brought into contact with the edge portion of the wafer W, and FIG. 4 is a cross-sectional view of the edge portion that has been polished by the polishing tape 5 when the disk head 12 is in a position shown in FIG. 3. As shown in FIG. 3, the polishing tape 5 moves together with the disk head 12 in the tangential direction of the wafer W. Therefore, as shown in FIG. 4, the polishing tape 5 polishes outermost part of the edge portion of the wafer W, thus forming a small step in the edge portion.

Figure 5:
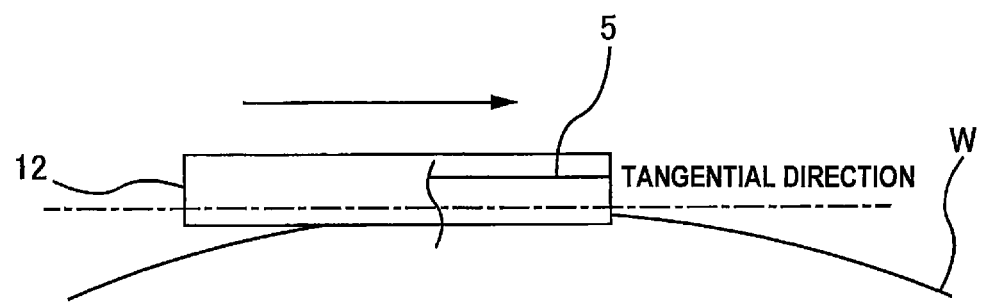
FIG. 5 is a plan view showing a relative position of the disk head and the edge portion of the wafer when the disk head is further moved in a tangential direction of the wafer.
Figure 6:
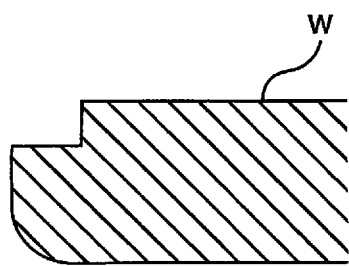
FIG. 6 is a cross-sectional view of the edge portion that has been polished by the polishing tape when the disk head is in a position shown in FIG. 5.

FIG. 5 is a plan view showing a relative position of the disk head 12 and the edge portion of the wafer W when the disk head 12 is further moved in the tangential direction of the wafer W, and FIG. 6 is a cross-sectional view of the edge portion that has been polished by the polishing tape 5 when the disk head 12 is in a position shown in FIG. 5. As the disk head 12 further moves, the polishing tape 5 polishes a more inside part of the edge portion of the wafer W, thus forming a larger step in the edge portion, as shown in FIG. 6.

Figure 7:
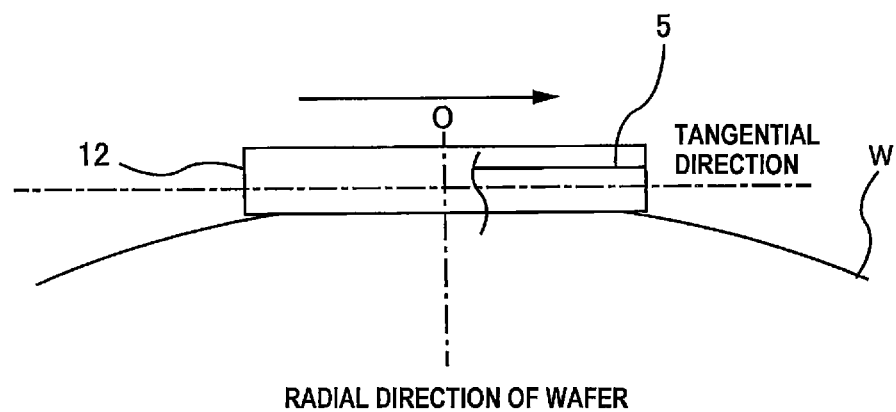
FIG. 7 is a plan view showing a relative position of the disk head and the edge portion of the wafer when a central axis of the disk head coincides with a radial direction of the wafer as viewed from above the wafer.
Figure 8:
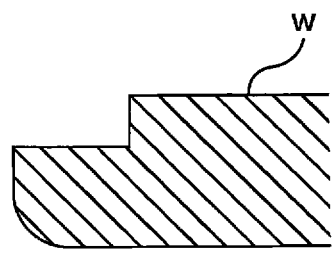
FIG. 8 is a cross-sectional view of the edge portion that has been polished by the polishing tape when the disk head is in a position shown in FIG. 7.

FIG. 7 is a plan view showing a relative position of the disk head 12 and the edge portion of the wafer W when the central axis O of the disk head 12 coincides with the radial direction of the wafer W as viewed from above the wafer W, and FIG. 8 is a cross-sectional view of the edge portion that has been polished by the polishing tape 5 when the disk head 12 is in a position shown in FIG. 7. As shown in FIG. 8, the polishing tape 5 polishes innermost part of the edge portion of the wafer W, thus forming a larger step in the edge portion.

As shown in FIG. 4, FIG. 6, and FIG. 8, polishing of the edge portion progresses gradually from the outside to the inside of the edge portion. Therefore, it is possible to use two types of polishing tapes to perform rough polishing of the edge portion and finish polishing of the edge portion. Specifically, a first polishing tape having a rough polishing surface is used to polish the edge portion so as to form a step in the edge portion, and a second polishing tape having a fine polishing surface is used to further polish the step, so that a smooth vertical surface can be formed in the edge portion.

Figure 9:
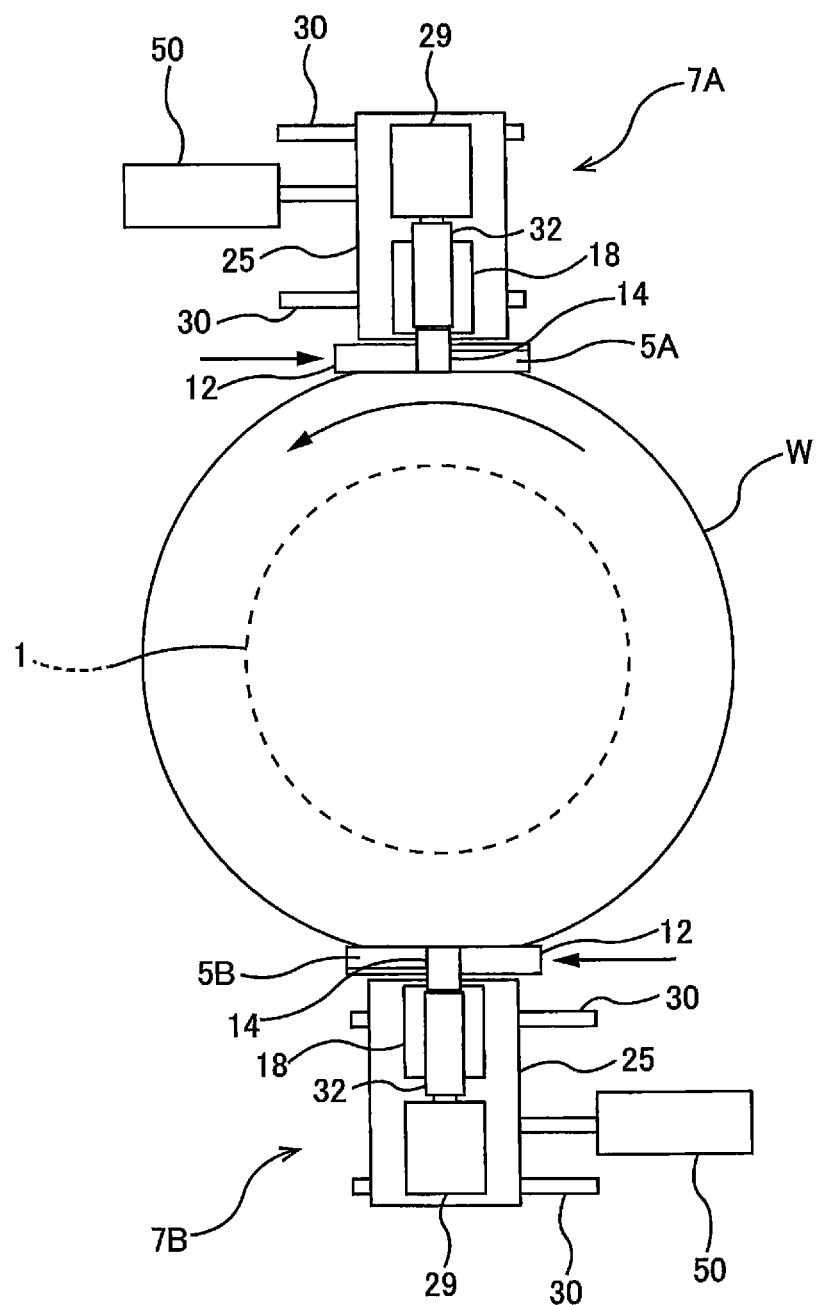
FIG. 9 is a schematic view showing a polishing apparatus having two polishing units.

FIG. 9 is a schematic view showing a polishing apparatus having two polishing units 7A, 7B. The first polishing unit 7A and the second polishing unit 7B shown in FIG. 9 have the same configuration as the polishing unit 7 shown in FIG. 1 and FIG. 2. For simplifying descriptions, some of structural elements of the first polishing unit 7A and the second polishing unit 7B are not shown in FIG. 9.

The first polishing unit 7A and the second polishing unit 7B are arranged along the edge portion of the wafer W held by the substrate holder 1. In the embodiment shown in FIG. 9, the arrangement of the first polishing unit 7A and the second polishing unit 7B is symmetrical with respect to the wafer W held on the substrate holder 1. A first polishing tape 5A having a rough polishing surface is attached to the first polishing unit 7A, while a second polishing tape 5B having a fine polishing surface is attached to the second polishing unit 7B.

Polishing of the edge portion of the wafer W is performed as follows. The wafer W is horizontally held by the substrate holder 1 and is rotated about the central axis of the wafer W. The polishing liquid is supplied from the polishing-liquid supply nozzle 10 (see FIG. 2) onto the central portion of the wafer W. In this state, disk head 12 of the first polishing unit 7A is moved in a tangential direction of the wafer W to bring the first polishing tape 5A into contact with the edge portion of the wafer W. The first polishing tape 5A is pressed against the edge portion of the wafer W by circumferential surface of the disk head 12 of the first polishing unit 7A, thereby forming a step in the edge portion.

While or after the first polishing tape 5A is in contact with the edge portion of the wafer W, disk head 12 of the second polishing unit 7B is moved in a tangential direction of the wafer W to bring the second polishing tape 5B into contact with the edge portion of the wafer W. The second polishing tape 5B is pressed against the step by circumferential surface of the disk head 12 of the second polishing unit 7B, thereby further polishing the step.

The first polishing tape 5A is a rough-polishing tape having a rough polishing surface, while the second polishing tape 5B is a finish-polishing tape having a fine polishing surface. According to this embodiment, the first polishing tape 5A polishes the edge portion of the wafer W at a high polishing rate (or removal rate), and the second polishing tape 5B finish-polishes the step that has been formed by the first polishing tape 5A. Therefore, this embodiment can form a smooth vertical surface of the step while achieving an increased polishing rate of the wafer W.

Three or more polishing units 7 may be provided. In this case, three or more polishing tapes having different surface roughness may be used.

Figure 10:
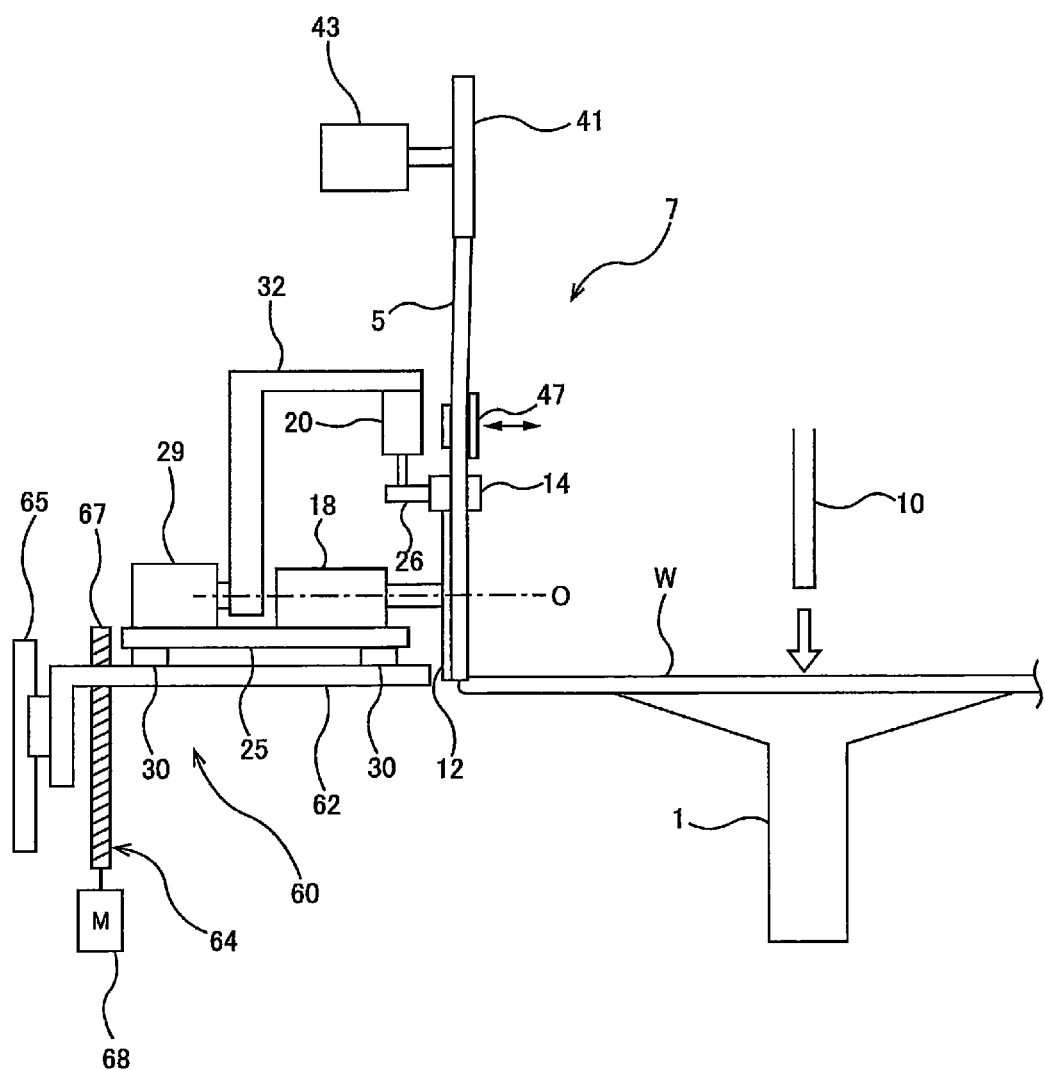
FIG. 10 is a side view showing another embodiment of a polishing apparatus.

FIG. 10 is a side view showing another embodiment of a polishing apparatus. Structures and operations of this embodiment, which are not described particularly, are the same as those of the embodiment shown in FIG. 1 and FIG. 2, and their repetitive descriptions are omitted. As shown in FIG. 10, the polishing unit 7 according to this embodiment includes an elevating mechanism 60 for elevating and lowering disk head 12, nip roller 14, head motor 18, and pivoting motor 29. This elevating mechanism 60 includes an elevation table 62 supporting horizontal linear guides 30, and an elevating actuator 64 for elevating and lowering the elevation table 62. The elevation table 62 is coupled to a vertical linear guide 65, which is configured to restrict movement of the elevation table 62 to vertical direction.

The elevating actuator 64 includes a ball screw 67 rotatably coupled to the elevation table 62, and a servomotor 68 for rotating the ball screw 67. When the servomotor 68 rotates the ball screw 67, the elevation table 62 is elevated or lowered. Since the disk head 12, the nip roller 14, the head motor 18, and the pivoting motor 29 are coupled to the elevation table 62 through the horizontal linear guides 30 and the base 25, the elevating actuator 64 can elevate and lower the disk head 12, the nip roller 14, the head motor 18, and the pivoting motor 29 together. The polishing unit 7 thus constructed can precisely control an amount of polishing of the wafer W (i.e. a depth of the step formed in the edge portion).

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

INDUSTRIAL APPLICABILITY

The present invention is applicable to a polishing apparatus and a polishing method for polishing an edge portion of a wafer with use of a polishing tape.

REFERENCE SIGNS LIST 1 substrate holder
5, 5A, 5B polishing tape
7, 7A, 7B polishing unit
10 polishing-liquid supply nozzle
12 disk head
14 nip roller
18 head motor
20 pneumatic cylinder (nip-roller biasing device)
25 base
26 bearing arm
29 pivoting motor
30 horizontal linear guide
32 pivot arm
41 first tension reel
42 second tension reel
43 first tension motor 44 second tension motor
47 first guide roller
48 second guide roller
50 pneumatic cylinder (head moving device)
51 piston rod
60 elevating mechanism
62 elevation table
64 elevating actuator
65 vertical linear guide
67 ball screw
68 servomotor

The invention claimed is:

1. A polishing apparatus comprising:
a substrate holder having a substrate-holding surface, the substrate holder being configured to hold a substrate with the substrate-holding surface and to rotate the substrate; and
a polishing unit configured to polish an edge portion of the substrate with use of a polishing tape,
the polishing unit including:
a disk head having a circumferential surface for supporting the polishing tape, the disk head having a central axis which is parallel to the substrate-holding surface and is perpendicular to a tangential direction of the substrate;
an elevating mechanism configured to elevate and lower the disk head; and
a nip roller configured to press the polishing tape against the circumferential surface of the disk head to curve the polishing tape along the circumferential surface, the nip roller being adjacent to the circumferential surface of the disk head such that the polishing tape is sandwiched between the disk head and the nip roller.

2. The polishing apparatus according to claim 1, wherein the polishing unit further includes:
a base supporting the disk head;
a horizontal linear guide extending parallel to the tangential direction of the substrate, the base being movably supported by the linear guide, the disk head being movable together with the base.

3. The polishing apparatus according to claim 2, wherein the elevating mechanism includes:
an elevation table supporting the horizontal linear guide; and
an elevating actuator configured to elevate and lower the elevation table.

4. The polishing apparatus according to claim 3, wherein the elevating actuator includes:
a ball screw rotatably coupled to the elevation table; and
a servomotor coupled to the ball screw.

5. The polishing apparatus according to claim 3, wherein the elevating mechanism further includes a vertical linear guide configured to restrict movement of the elevation table to a vertical direction, the elevation table being coupled to the vertical linear guide.

6. The polishing apparatus according to claim 2, wherein the nip roller is movable with the base.

7. A polishing apparatus comprising:
a substrate holder having a substrate-holding surface, the substrate holder being configured to hold a substrate with the substrate-holding surface and to rotate the substrate; and
a polishing unit configured to polish an edge portion of the substrate with use of a polishing tape,
the polishing unit including:
a disk head having a circumferential surface for supporting the polishing tape, the disk head having a central axis which is parallel to the substrate-holding surface and is perpendicular to a tangential direction of the substrate;
an elevating mechanism configured to elevate and lower the disk head
a nip roller configured to press the polishing tape against the circumferential surface of the disk head to curve the polishing tape along the circumferential surface; and
a nip-roller moving device configured to move the nip roller around the central axis of the disk head.

8. The polishing apparatus according to claim 7, wherein the nip-roller moving device is secured to the base.

9. The polishing apparatus according to claim 1, wherein the polishing unit further includes a head motor configured to rotate the disk head about the central axis of the disk head.

10. The polishing apparatus according to claim 1, wherein the polishing unit further includes:
a first reel and a second reel holding both ends of the polishing tape; and
a first motor and a second motor configured to generate torques for rotating the first reel and the second reel in opposite directions.

11. The polishing apparatus according to claim 1, wherein the substrate-holding surface has a circular shape, and the central axis of the disk head is perpendicular to a tangential direction of the substrate-holding surface.

12. The polishing apparatus according to claim 11, wherein the horizontal linear guide extends parallel to the tangential direction of the substrate-holding surface.

13. The polishing apparatus according to claim 7, the polishing unit further includes:
a base supporting the disk head; and
a horizontal linear guide extending parallel to the tangential direction of the substrate, the base being movably supported by the linear guide, the disk head and the nip roller being movable together with the base.

* * * * *